(12) United States Patent
Akahane

(10) Patent No.: US 12,155,319 B2
(45) Date of Patent: Nov. 26, 2024

(54) POWER MODULE AND LEVEL CONVERSION CIRCUIT THEREOF

(71) Applicant: FUJI ELECTRIC CO., LTD., Kawasaki (JP)

(72) Inventor: Masashi Akahane, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 717 days.

(21) Appl. No.: 17/182,806

(22) Filed: Feb. 23, 2021

(65) Prior Publication Data

US 2021/0184562 A1 Jun. 17, 2021

Related U.S. Application Data

(63) Continuation of application No. PCT/JP2020/003479, filed on Jan. 30, 2020.

(30) Foreign Application Priority Data

Mar. 14, 2019 (JP) .................................. 2019-046637

(51) Int. Cl.
*H02M 3/155* (2006.01)
*H02M 1/088* (2006.01)
(Continued)

(52) U.S. Cl.
CPC ......... *H02M 7/5387* (2013.01); *H02M 1/088* (2013.01); *H02M 3/155* (2013.01);
(Continued)

(58) Field of Classification Search
CPC ...... H02M 1/12; H02M 3/3155; H02M 3/155; H02M 3/33507; H02M 3/33546;
(Continued)

(56) References Cited

U.S. PATENT DOCUMENTS

| | | | |
|---|---|---|---|
| 9,843,311 B2 * | 12/2017 | Green | H02M 3/158 |
| 11,095,283 B2 * | 8/2021 | Inoue | H03K 17/18 |
| 11,283,438 B2 * | 3/2022 | Akiyama | H02M 1/32 |
| 2004/0252432 A1 | 12/2004 | Sasaki et al. | |

(Continued)

FOREIGN PATENT DOCUMENTS

| | | |
|---|---|---|
| EP | 3389186 A1 | 10/2018 |
| JP | 2003-274672 A | 9/2003 |

(Continued)

OTHER PUBLICATIONS

International Search Report for PCT/JP2020/003479, mailed on Apr. 28, 2020.
Written Opinion for PCT/JP2020/003479, mailed on Apr. 28, 2020.

*Primary Examiner* — Jeffrey A Gblende
(74) *Attorney, Agent, or Firm* — Rabin & Berdo, P.C.

(57) ABSTRACT

A power module including a plurality of drive devices. Each drive device includes a high-side drive element and a low-side drive element that drive a load, a high-side control circuit that controls the high-side drive element, and a low-side control circuit that controls the low-side drive element. Each of the high-side and low-side control circuits includes an abnormality detection circuit that detects an abnormal state of the high-side or low-side drive element, a capability-switch-function-equipped drive circuit that switches a drive capability of the high-side or low-side drive element, responsive to the detection of the abnormal state by any one of the abnormality detection circuits in the plurality of drive devices, and a drive capability switch circuit that switches a drive capability of the capability-switch-function-equipped drive circuit, responsive to the detection of the abnormal state by the abnormality detection circuit.

20 Claims, 13 Drawing Sheets

(51) Int. Cl.
*H02M 7/5387* (2007.01)
*H03K 17/567* (2006.01)
*H02M 1/00* (2006.01)

(52) U.S. Cl.
CPC ......... *H03K 17/567* (2013.01); *H02M 1/0054* (2021.05); *H03K 2217/0063* (2013.01); *H03K 2217/0072* (2013.01)

(58) Field of Classification Search
CPC ............. H02M 7/1557; H02M 7/1626; H02M 1/4208; H02M 7/53871; H02M 7/12; H02M 7/219; H02M 7/151; H02M 1/4233; H02M 5/4585; H02M 7/217; H02M 1/08; H02M 7/1552; H02M 7/1623; H02M 1/4225; H02M 3/33592; H02M 3/073; H02M 3/10; H02M 3/135; H02M 3/137; H02M 7/10; H02M 7/00; H02M 7/06; H02M 7/064; H02M 7/068; H02M 3/156; H02M 7/5387; G05F 1/30; G05F 1/33; G05F 1/32; G05F 1/34; G05F 1/38; G05F 1/52; H02J 7/12
See application file for complete search history.

(56) References Cited

U.S. PATENT DOCUMENTS

| | | | |
|---|---|---|---|
| 2006/0044045 A1* | 3/2006 | Sakata | H03K 17/6871 327/434 |
| 2008/0074819 A1 | 3/2008 | Sasaki et al. | |
| 2011/0317315 A1* | 12/2011 | Motohashi | H02H 7/122 361/18 |
| 2014/0218099 A1 | 8/2014 | Yamada et al. | |
| 2016/0011266 A1* | 1/2016 | Osanai | G01R 31/42 324/762.01 |
| 2017/0134018 A1 | 5/2017 | Manishi et al. | |
| 2018/0269867 A1 | 9/2018 | Terashima | |
| 2018/0301977 A1 | 10/2018 | Yamada | |
| 2018/0351475 A1* | 12/2018 | Yokoi | H02M 7/538 |
| 2019/0181853 A1 | 6/2019 | Kobayashi et al. | |

FOREIGN PATENT DOCUMENTS

| | | |
|---|---|---|
| JP | 2005-006464 A | 1/2005 |
| JP | 2011-120381 A | 6/2011 |
| JP | 2012-010544 A | 1/2012 |
| JP | 2014-150696 A | 8/2014 |
| JP | 2017-093065 A | 5/2017 |
| JP | 2018-057072 A | 4/2018 |
| JP | 2018-157670 A | 10/2018 |
| JP | 2018-182927 A | 11/2018 |

* cited by examiner

|  | drv | DSEL | MP1 | MN1 | MP2 | MN2 |
|---|---|---|---|---|---|---|
| NORMAL OPERATION | H | L | ON | OFF | OFF | OFF |
|  | L | L | OFF | ON | OFF | OFF |
| DRIVE CAPABILITY DOUBLED | H | H | ON | OFF | ON | OFF |
|  | L | H | OFF | ON | OFF | ON |

FIG. 4

POWER MODULE AND LEVEL CONVERSION CIRCUIT THEREOF

CROSS-REFERENCE TO RELATED APPLICATION

This application is a continuation application of International Application PCT/JP2020/003479 filed on Jan. 30, 2020 which designated the U.S., which claims priority to Japanese Patent Application No. 2019-046637, filed on Mar. 14, 2019, the entire contents of which are incorporated herein by reference.

BACKGROUND OF THE INVENTION

1. Field of the Invention

The embodiments discussed herein relate to a power module including a plurality of drive devices for driving a multiphase motor per phase in a single package and to a level conversion circuit of the power module.

2. Background of the Related Art

An intelligent power module (IPM) is known as an apparatus for driving a load such as a three-phase motor. Such an IPM includes drive elements for driving a load and a control circuit for controlling these drive elements. The control circuit includes a protection circuit for protecting the drive elements from resulting in an overcurrent state or an overheat state.

When the protection circuit detects that a drive element is in a significant overcurrent state or overheat state, the control circuit stops the operation of the drive element. There are also cases in which the control circuit switches the drive capability of a drive element when the protection circuit detects a predetermined overcurrent state or overheat state (see Japanese Laid-open Patent Publication No. 2003-274672, for example).

Japanese Laid-open Patent Publication No. 2003-274672 discusses a method for switching the drive capability of a drive element by switching the value of a gate resistor connected in series with the gate of the drive element. That is, when an overcurrent state and an overheat state of a drive element are not detected, the gate resistor is set with a large value, to reduce the occurrence of switching noise. In contrast, when an overcurrent state and an overheat state of the drive element are detected, the gate resistor is set with a small value, to reduce the switching loss of the drive element.

Conventional technology for switching the drive capability of a drive element is related to improving the switching noise and the switching loss of a drive element of an individual drive device. Thus, in the case of a power module including a plurality of drive devices, too, the drive capability of a drive element is individually switched per drive device. Thus, due to the variation between drive elements and the difference between the characteristics thereof, the resistance values of the corresponding gate resistors are switched at different timing. These resistance values are also switched at different timing between high-side drive elements and low-side drive elements constituting half-bridge output circuits of the drive devices. That is, the conventional technology does not provide the same sufficient switching noise and switching loss reduction effects to a power module including a plurality of drive devices as it does to an individual drive device.

SUMMARY OF THE INVENTION

According one aspect of the embodiments, there is provided a power module including a plurality of drive devices, each of which includes a high-side drive element and a low-side drive element that drive a load, a high-side control circuit that controls the high-side drive element, and a low-side control circuit that controls the low-side drive element, wherein each of the high-side control circuit and the low-side control circuit includes an abnormality detection circuit that detects an abnormal state of the high-side drive element or low-side drive element, a capability-switch-function-equipped drive circuit that switches a drive capability of the high-side drive element or low-side drive element, responsive to the detection of the abnormal state by any one of the plurality of abnormality detection circuits in the plurality of drive devices, and a drive capability switch circuit that switches a drive capability of the capability-switch-function-equipped drive circuit, responsive to the detection of the abnormal state by the abnormality detection circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 4 is a truth table illustrating an example of an operation of the drive-capability-switch-function-equipped drive circuit according to the first embodiment;

DETAILED DESCRIPTION OF THE INVENTION

Figure 1:
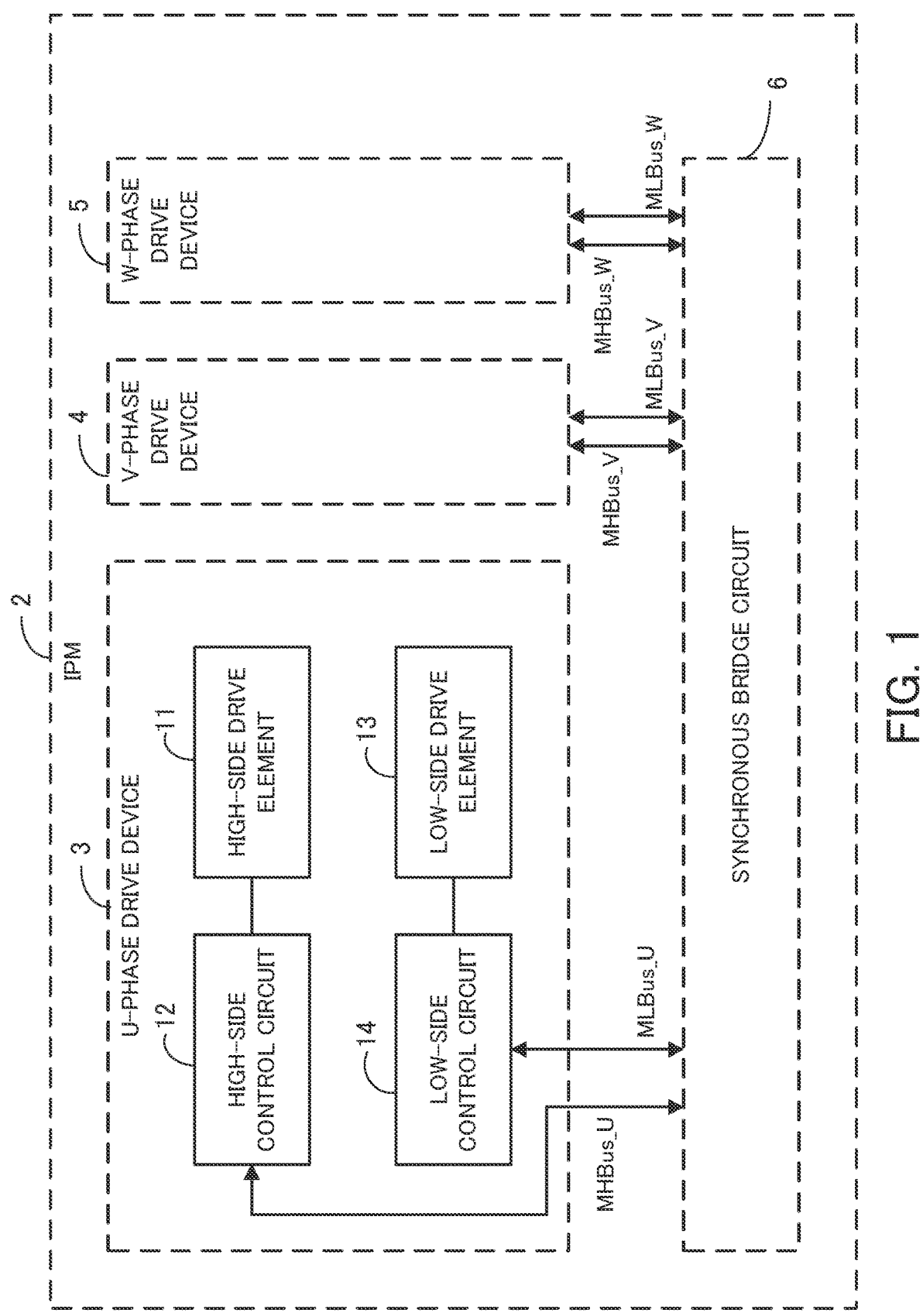
FIG. 1 is a block diagram illustrating an outline of an IPM to which a power module according to a first embodiment is applied.

Hereinafter, power modules according to embodiments will be described in detail with reference to drawings. An individual embodiment will be described based on an example in which a power module is applied to an IPM including three drive devices that drive a three-phase motor. Like reference characters refer to like elements throughout the drawings. An individual embodiment may be achieved by partially combining a plurality of embodiments without causing inconsistency. In the following description, the name of an individual terminal and a voltage, signal, etc. at that terminal will be described by using the same reference character, as needed.

First Embodiment

FIG. 1 is a block diagram illustrating an outline of an IPM to which a power module according to a first embodiment is applied.

This IPM 2 includes a U-phase drive device 3, a V-phase drive device 4, and a W-phase drive device 5 that supply a three-phase alternating current to a three-phase motor and a synchronous bridge circuit 6. The U-phase drive device 3 is connected to the synchronous bridge circuit 6 via buses MHBus_U and MLBus_U. The V-phase drive device 4 is connected to the synchronous bridge circuit 6 via buses MHBus_V and MLBus_V. The W-phase drive device 5 is connected to the synchronous bridge circuit 6 via buses MHBus_W and MLBus_W.

Since the U-phase drive device 3, the V-phase drive device 4, and the W-phase drive device 5 included in the IPM 2 have the same configuration, the configuration of the U-phase drive device 3 will hereinafter be described as a representative example.

The U-phase drive device 3 includes a high-side drive element 11, a high-side control circuit 12 corresponding thereto, a low-side drive element 13, and a low-side control circuit 14 corresponding thereto. The high-side control circuit 12 is connected to the synchronous bridge circuit 6 via the bus MHBus_U, and the low-side control circuit 14 is connected to the synchronous bridge circuit 6 via the bus MLBus_U. The high-side control circuit 12 and the low-side control circuit 14 have drive capability switch functions for switching the drive capabilities of the high-side drive element 11 and the low-side drive element 13, respectively. When the high-side drive element 11 or the low-side drive element 13 indicates a certain current value or a certain temperature value, the corresponding drive capability switch function switches the drive capability of the corresponding high-side drive element 11 or low-side drive element 13.

With this configuration of the IPM 2, for example, when the high-side drive element 11 indicates the certain current value or the certain temperature value, the high-side control circuit 12 in the U-phase drive device 3 switches the drive capability of the high-side drive element 11. In this case, the high-side control circuit 12 notifies the synchronous bridge circuit 6 of the switching of the drive capability via the bus MHBus_U. When the synchronous bridge circuit 6 is notified that the high-side control circuit 12 in the U-phase drive device 3 has switched the drive capability, the synchronous bridge circuit 6 notifies all the other control circuits of the switching of the drive capability via all the other buses connected to the synchronous bridge circuit 6. That is, the synchronous bridge circuit 6 notifies the low-side control circuit 14 in the U-phase drive device 3 of the switching of the drive capability via the bus MLBus_U. Likewise, the synchronous bridge circuit 6 notifies the high-side drive circuit and the low-side drive circuit in the V-phase drive device 4 of the switching of the drive capability via the buses MHBus_V and MLBus_V. In addition, the synchronous bridge circuit 6 notifies the high-side drive circuit and the low-side drive circuit in the W-phase drive device 5 of the switching of the drive capability via the buses MHBus_W and MLBus_W. When notified of the switching of the drive capability, the low-side control circuit 14 in the U-phase drive device 3, the high-side drive circuit and the low-side drive circuit in the V-phase drive device 4, and the high-side drive circuit and the low-side drive circuit in the W-phase drive device 5 each switch their respective drive capabilities. In this way, since all the drive capabilities of the U-phase drive device 3, the V-phase drive device 4, and the W-phase drive device 5 in the IPM 2 are switched at the same time, the drive capabilities among the three phases are balanced, and the switching noise and switching loss reduction effects are improved.

Figure 2:
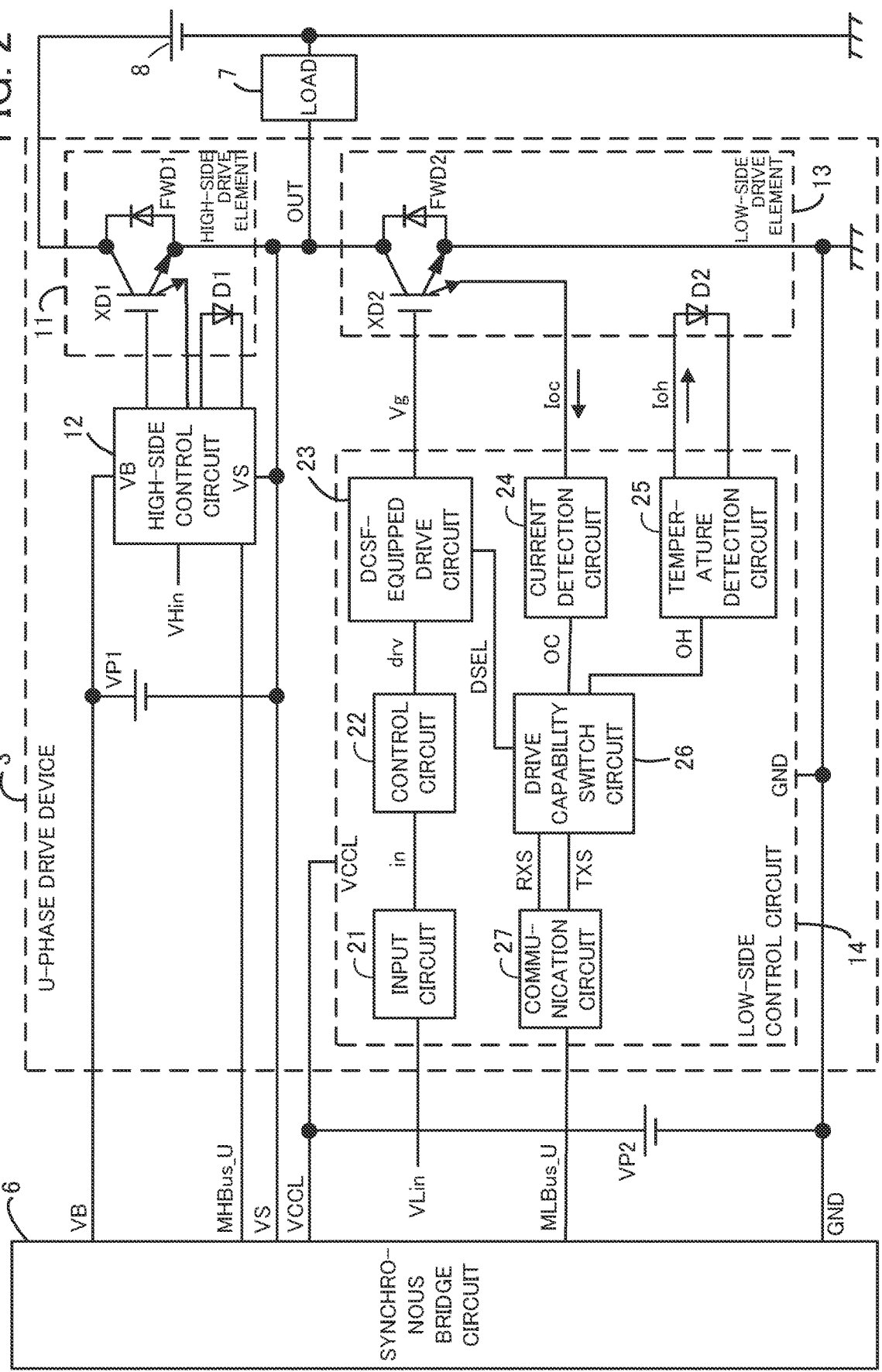
FIG. 2 is a circuit diagram illustrating an example of a configuration of a U-phase drive device according to the first embodiment.

FIG. 2 is a circuit diagram illustrating an example of a configuration of the U-phase drive device according to the first embodiment.

The U-phase drive device 3 includes the high-side drive element 11, the high-side control circuit 12 corresponding thereto, the low-side drive element 13, and the low-side control circuit 14 corresponding thereto. Since the high-side control circuit 12 has the same configuration as that of the low-side control circuit 14, its internal configuration is not illustrated in FIG. 2.

The high-side drive element 11 includes a switching element XD1, and the low-side drive element 13 includes a switching element XD2. In this example, while insulated gate bipolar transistors (IGBT) are used as the switching elements XD1 and XD2, metal-oxide-semiconductor field-effect transistors (MOSFETs) may alternatively be used as the switching elements XD1 and XD2. The emitter of the switching element XD1 is connected to the collector of the switching element XD2, to form a half-bridge output circuit. The connection part between the emitter of the switching element XD1 and the collector of the switching element XD2 is connected to one terminal of a load 7. The other terminal of the load 7 is connected to ground. This load 7 may be the U-phase winding of the three-phase motor. The collector of the switching element XD1 is connected to the positive terminal of a power supply 8, and the emitter of the switching element XD2 is connected to ground.

The switching element XD1 in the high-side drive element 11 is connected in inverse-parallel to a freewheeling diode FWD1, and the switching element XD2 in the low-side drive element 13 is connected in inverse-parallel to a freewheeling diode FWD2. The high-side and low-side drive elements 11 and 13 include temperature detection diodes D1 and D2, respectively. Each of the switching elements XD1 and XD2 is provided with a current sensing element that is formed by an IGBT and that is for current detection. The emitter of the current sensing element in the high-side drive element 11 is connected to the high-side control circuit 12, and the emitter of the current sensing element in the low-side drive element 13 is connected to the low-side control circuit 14. In addition, the gate of the switching element XD1 and the corresponding current sensing element and the anode and the cathode of the diode D1 are connected to the high-side control circuit 12. Likewise, the gate of the switching element XD2 and the corresponding current sensing element and the anode and the cathode of the diode D2 are connected to the low-side control circuit 14.

The high-side control circuit 12 has a high-side power supply terminal VB, which is connected to the positive terminal of a power supply VP1. The negative terminal of the power supply VP1 is connected to a high-side reference potential terminal VS of the high-side control circuit 12 and an output terminal OUT of the half-bridge output circuit. The positive terminal and the negative terminal of the power supply VP1 are also connected to the synchronous bridge circuit 6. The high-side control circuit 12 also includes an input terminal that receives a high-side control signal VHin for controlling the switching element XD1 from an upper control device. The high-side control circuit 12 is connected to the synchronous bridge circuit 6 via the bus MHBus_U.

The low-side control circuit 14 includes an input circuit 21, a control circuit 22, a drive-capability-switch-function-equipped (DCSF-equipped) drive circuit 23, a current detection circuit 24, a temperature detection circuit 25, a drive capability switch circuit 26, and a communication circuit 27. The low-side control circuit 14 includes a low-side power supply terminal VCCL and a ground terminal GND. The low-side power supply terminal VCCL is connected to the positive terminal of a power supply VP2, and the negative terminal of the power supply VP2 is connected to the ground terminal GND. The positive terminal and the negative terminal of the power supply VP2 are also connected to the synchronous bridge circuit 6. The power supply VP1 for the high-side control circuit 12 is generated from this power supply VP2 supplying power to the low-side control circuit 14.

The input circuit 21 includes an input terminal that is connected to an upper control device and that receives a low-side control signal VLin for controlling the switching element XD2. The input circuit 21 also includes an output terminal that outputs a signal in. The output terminal of the input circuit 21 is connected to the input terminal of the control circuit 22, and the control circuit 22 receives the signal in and outputs a drive signal drv. The output terminal of the control circuit 22 is connected to the input terminal of the DCSF-equipped drive circuit 23, and the output terminal of the DCSF-equipped drive circuit 23 is connected to the gate of the switching element XD2 and supplies a gate signal Vg. The input terminal of the current detection circuit 24 is connected to the emitter of the current sensing element in the low-side drive element 13 and receives a current Ioc corresponding to the collector current of the switching element XD2. The output terminal of the current detection circuit 24 is connected to an input terminal of the drive capability switch circuit 26 and supplies an overcurrent detection signal OC corresponding to the current Ioc. The temperature detection circuit 25 includes a terminal that supplies a certain current Ioh to the anode of the diode D2 and that receives a current outputted by the cathode of the diode D2. The output terminal of the temperature detection circuit 25 is connected to another input terminal of the drive capability switch circuit 26 and supplies an overheat detection signal OH corresponding to the temperature of the switching element XD2. The drive capability switch circuit 26 has an output terminal connected to the control terminal of the DCSF-equipped drive circuit 23. When the overcurrent detection signal OC or the overheat detection signal OH meets a predetermined condition, the drive capability switch circuit 26 outputs a capability switch signal DSEL via this output terminal.

First, the communication circuit 27 is connected to the synchronous bridge circuit 6 via the bus MLBus_U. The communication circuit 27 is also connected to the drive capability switch circuit 26. When the drive capability switch circuit 26 outputs the capability switch signal DSEL, the communication circuit 27 receives a signal TXS from the drive capability switch circuit 26 and notifies the synchronous bridge circuit 6 of this signal reception via the bus MLBus_U. When notifies by the synchronous bridge circuit 6 of reception of a capability switch signal DSEL from another drive device via the bus MLBus_U, the communication circuit 27 outputs a signal RXS to the drive capability switch circuit 26. Upon receiving the signal RXS, the drive capability switch circuit 26 outputs the capability switch signal DSEL.

Figure 3:
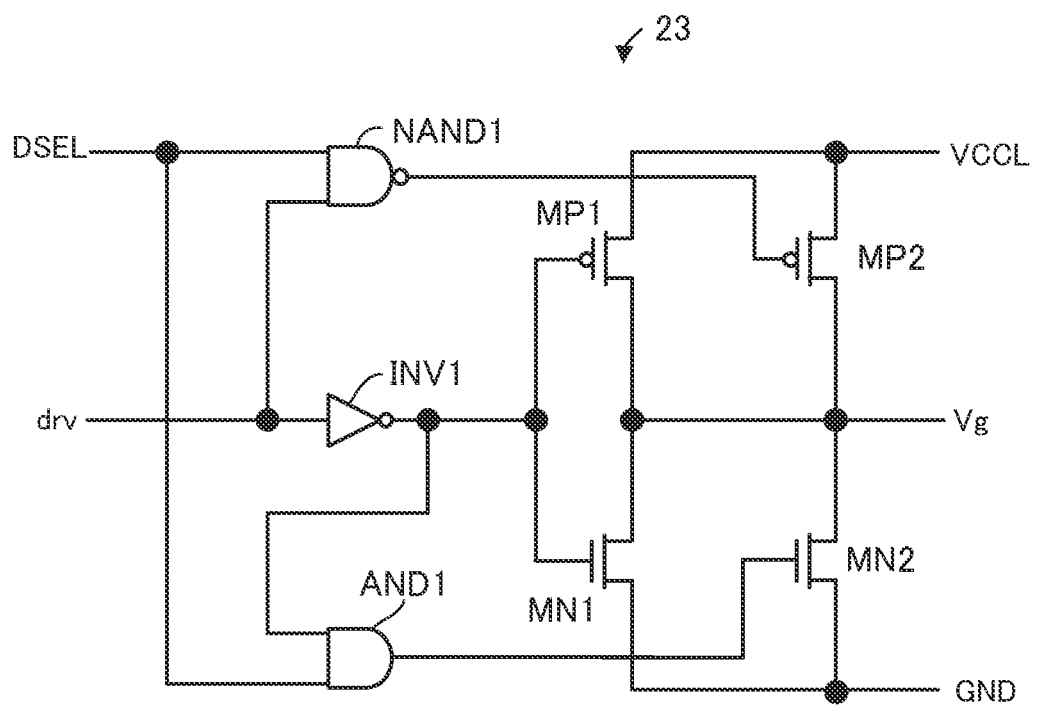
FIG. 3 is a circuit diagram illustrating an example of a configuration of a drive-capability-switch-function-equipped drive circuit according to the first embodiment.

FIG. 3 is a circuit diagram illustrating an example of a configuration of the DCSF-equipped drive circuit according to the first embodiment, and FIG. 4 is a truth table illustrating an example of an operation of the DCSF-equipped drive circuit to according the first embodiment.

The DCSF-equipped drive circuit 23 includes a NAND circuit NAND1, an AND circuit AND1, an inverter circuit INV1, P-channel MOSFETs (which will hereinafter be referred to as PMOS transistors) MP1 and MP2, and N-channel MOSFETs (which will hereinafter be referred to as NMOS transistors) MN1 and MN2.

The DCSF-equipped drive circuit 23 includes an input terminal that receives the drive signal drv, and this input terminal is connected to the input terminal of the inverter circuit INV1 and one input terminal of the NAND circuit NAND1. The DCSF-equipped drive circuit 23 also includes a control terminal that receives the capability switch signal DSEL, and this control terminal is connected to the other input terminal of the NAND circuit NAND1 and one input terminal of the AND circuit AND1.

The output terminal of the inverter circuit INV1 is connected to the gates of the PMOS transistor MP1 and the NMOS transistor MN1 and the other input terminal of the AND circuit AND1. The source of the PMOS transistor MP1 is connected to the low-side power supply terminal VCCL, and the source of the NMOS transistor MN1 is connected to the ground terminal GND. The drains of the PMOS transistor MP1 and the NMOS transistor MN1 are connected to each other and are connected to the output terminal that outputs the gate signal Vg.

The output terminal of the NAND circuit NAND1 is connected to the gate of the PMOS transistor MP2, and the output terminal of the AND circuit AND1 is connected to the gate of the NMOS transistor MN2. The source of the PMOS transistor MP2 is connected to the low-side power supply terminal VCCL, and the source of the NMOS transistor MN2 is connected to the ground terminal GND. The drains of the PMOS transistor MP2 and the NMOS transistor MN2 are connected to each other and are connected to the output terminal that outputs the gate signal Vg.

Next, an operation of the DCSF-equipped drive circuit 23 will be described. First, when the current detection circuit 24 or the temperature detection circuit 25 has not yet detected a certain current value or a certain temperature value, the drive capability switch circuit 26 outputs a low (L) level capability switch signal DSEL. In this case, since the NAND circuit NAND1 outputs a high (H) level signal irrespective of the logical state of the drive signal drv, the PMOS transistor MP2 is in an off-state. In addition, since the AND circuit AND1 outputs an L-level signal irrespective of the logical state of the drive signal drv, the NMOS transistor MN2 is also in an off-state.

In this state, if the DCSF-equipped drive circuit 23 receives an H-level drive signal drv, the inverter circuit INV1 is logically inverted and outputs an L-level signal. Thus, the PMOS transistor MP1 is set to an on-state while the NMOS transistor MN1 remains in an off-state. As a result, the gate signal Vg rises to an H level, and a current from the PMOS transistor MP1 is supplied as the source current to the gate of the switching element XD2.

When the drive signal drv drops to an L level, the inverter circuit INV1 is logically inverted and outputs an H-level signal. Thus, the PMOS transistor MP1 is set to an off-state, and the NMOS transistor MN1 is set to an on-state. As a result, the gate signal Vg drops to an L level, and the NMOS transistor MN1 draws the sink current from the gate of the switching element XD2 and flows the sink current to the ground terminal GND.

That is, as illustrated by the truth table in FIG. 4, in a normal operation in which the DCSF-equipped drive circuit 23 receives an L-level capability switch signal DSEL, both the PMOS transistor MP2 and the NMOS transistor MN2 are in an off-state. In this state, depending on the logical state of the drive signal drv, the PMOS transistor MP1 and the NMOS transistor MN1 are set to an on-state or an off-state.

Next, when the current detection circuit 24 or the temperature detection circuit 25 has detected a certain current value or a certain temperature value, the drive capability switch circuit 26 outputs an H-level capability switch signal DSEL.

In this state, if the DCSF-equipped drive circuit 23 receives an H-level drive signal drv, since the inverter circuit INV1 is logically inverted and outputs an L-level signal, the PMOS transistor MP1 is set to an on-state, and the NMOS transistor MN1 is set to an off-state. In addition, since each of the input terminals of the NAND circuit NAND1 receives an H-level signal, the NAND circuit NAND1 outputs an L-level signal and sets the PMOS transistor MP2 to an on-state. Since one input terminal of the AND circuit AND1 receives an L-level signal, the AND circuit AND1 outputs an L-level signal and sets the NMOS transistor MN2 to an off-state. If the PMOS transistors MP1 and MP2 are able to flow the same current value, the source current suppliable to the gate of the switching element XD2 becomes twice as high the current suppliable by the PMOS transistor MP1 alone. That is, the drive capability is doubled.

Next, if the DCSF-equipped drive circuit 23 receives an L-level drive signal drv, since the inverter circuit INV1 is logically inverted and outputs an H-level signal, the PMOS transistor MP1 is set to an off-state, and the NMOS transistor MN1 is set to an on-state. In addition, since one input terminal of the NAND circuit NAND1 receives an L-level signal, the NAND circuit NAND1 outputs an H-level signal and sets the PMOS transistor MP2 to an off-state. In this case, since each of the input terminals of the AND circuit AND1 receives an H-level signal, the AND circuit AND1 outputs an H-level signal and sets the NMOS transistor MN2 to an on-state. If the NMOS transistors MN1 and MN2 are able to flow the same current value, the sink current drawable from the gate of the switching element XD2 becomes twice as high as the current drawable by the NMOS transistor MN1 alone. That is, the drive capability is doubled.

Figure 5:
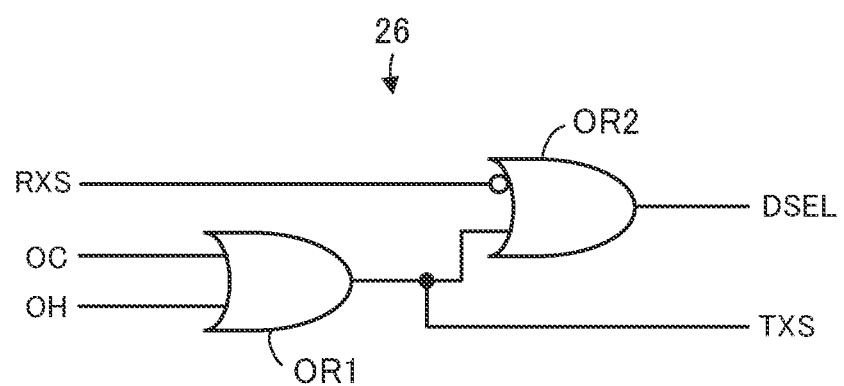
FIG. 5 is a circuit diagram illustrating an example of a configuration of the drive capability switch circuit according to the first embodiment.

FIG. 5 is a circuit diagram illustrating an example of a configuration of the drive capability switch circuit according to the first embodiment.

The drive capability switch circuit 26 includes OR circuits OR1 and OR2. A first input terminal of the OR circuit OR1 is connected to the output terminal of the current detection circuit 24. This first input terminal receives the overcurrent detection signal OC. A second input terminal of the OR circuit OR1 is connected to the output terminal of the temperature detection circuit 25. This second input terminal receives the overheat detection signal OH. The output terminal of the OR circuit OR1 is connected to a first input terminal of the OR circuit OR2 and an input terminal of the communication circuit 27. The signal TXS is transmitted to the communication circuit 27. A negative-logic second input terminal of the OR circuit OR2 is connected to the output of terminal the communication circuit 27. This second input terminal receives the signal RXS from the communication circuit 27. The output terminal of the OR circuit OR2 is connected to the control terminal of the DCSF-equipped drive circuit 23. The capability switch signal DSEL is transmitted to the DCSF-equipped drive circuit 23.

When the OR circuit OR1 receives an H-level overcurrent detection signal OC or overheat detection signal OH indicating detection of a certain current value or a temperature value, the drive capability switch circuit 26 outputs an H-level signal. This H-level signal is transmitted to the communication circuit 27 as the signal TXS and is also transmitted to the DCSF-equipped drive circuit 23 as the capability switch signal DSEL via the OR circuit OR2.

In addition, when the drive capability switch circuit 26 receives an H-level signal RXS from the communication circuit 27, the H-level signal RXS indicating that the high-side control circuit 12 in the U-phase drive device 3, the V-phase drive device 4, and the W-phase drive device 5 are in a normal state, the output state of the OR circuit OR2 depends on the output state of the OR circuit OR1. In contrast, when the drive capability switch circuit 26 receives an L-level signal RXS, the OR circuit OR2 outputs an H-level capability switch signal DSEL, irrespective of the output state of the OR circuit OR1.

Figure 6:
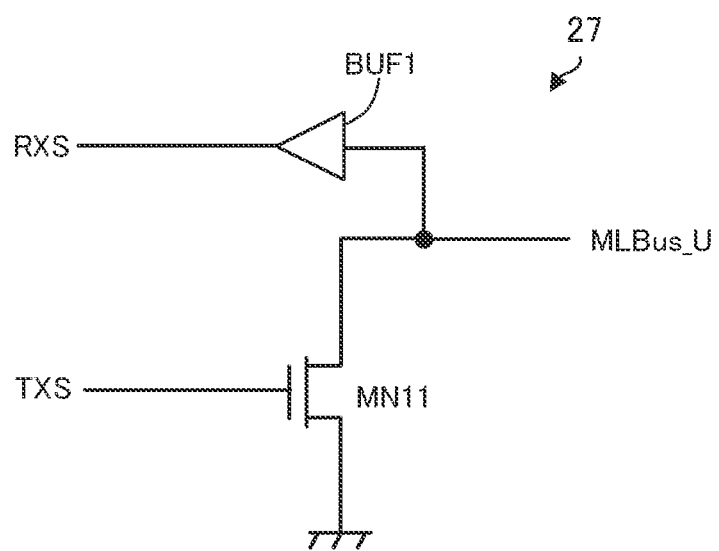
FIG. 6 is a circuit diagram illustrating an example of a configuration of a communication circuit according to the first embodiment.

FIG. 6 is a circuit diagram illustrating an example of a configuration of the communication circuit according to the first embodiment.

The communication circuit 27 includes a buffer circuit BUF1 and an NMOS transistor MN11 (a switching element). The input terminal of the buffer circuit BUF1 is connected to the synchronous bridge circuit 6 via the bus MLBus_U, and the output terminal of the buffer circuit BUF1 is connected to the input terminal of the drive capability switch circuit 26, the input terminal receiving the signal RXS.

The gate terminal of the NMOS transistor MN11 is connected to the output terminal of the drive capability switch circuit 26, the output terminal outputting the signal TXS. The drain terminal of the NMOS transistor MN11 is connected to the input terminal of the buffer circuit BUF1 and the synchronous bridge circuit 6 via the bus MLBus_U. The source terminal of the NMOS transistor MN11 is connected to ground.

When in a normal operation in which the drive capability switch circuit 26 does not receive an H-level overcurrent detection signal OC or overheat detection signal OH, the gate terminal of the NMOS transistor MN11 of the communication circuit 27 receives an L-level signal TXS and is in an off-state.

In addition, when the U-phase drive device 3, the V-phase drive device 4, and the W-phase drive device 5 are in a normal operation, since the bus MLBus_U is at an H level, the buffer circuit BUF1 of the communication circuit 27 outputs an H-level signal RXS to the drive capability switch circuit 26.

When the communication circuit 27 receives an H-level signal TXS from the drive capability switch circuit 26, the NMOS transistor MN11 is set to an on-state, and the bus MLBus_U is set to an L level. In this way, the communication circuit 27 notifies the synchronous bridge circuit 6 that the drive capability switch circuit 26 is outputting the capability switch signal DSEL. In contrast, when the bus MLBus_U is set to an L level, the buffer circuit BUF1 in the communication circuit 27 outputs an L-level signal RXS to notify the drive capability switch circuit 26 that another drive device is outputting the capability switch signal DSEL.

Figure 7:
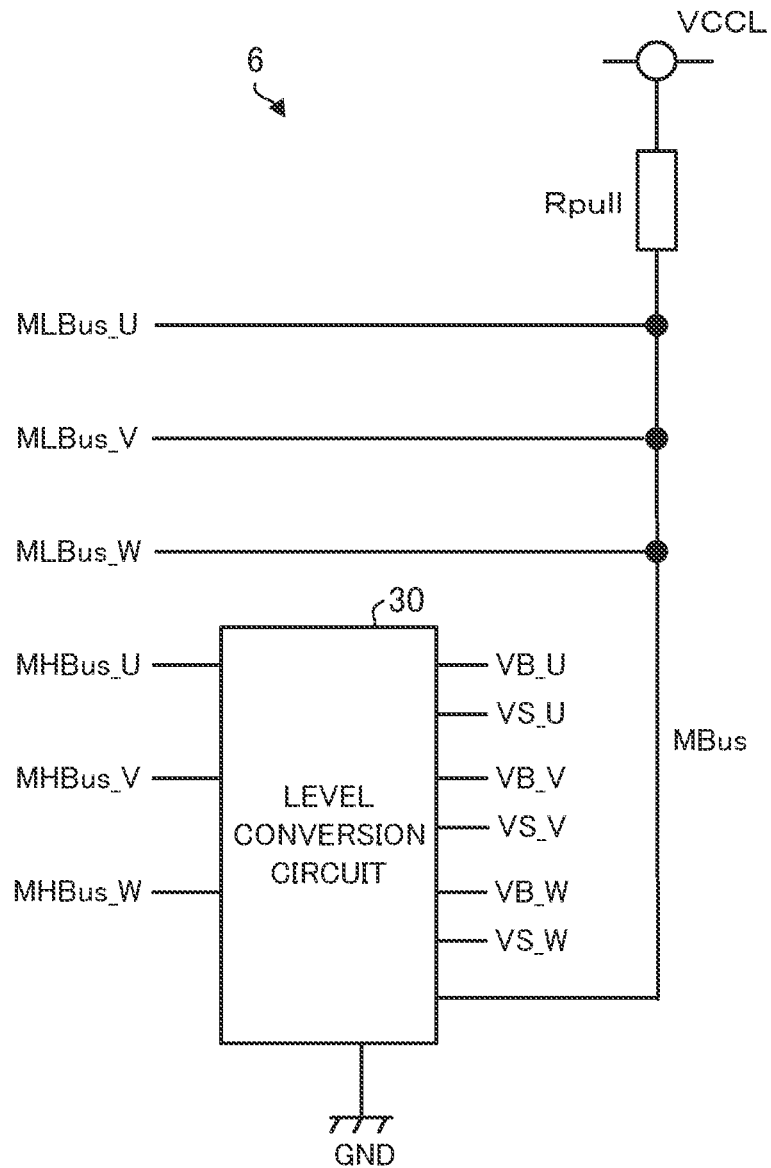
FIG. 7 is a circuit diagram illustrating an example of a configuration of a synchronous bridge circuit according to the first embodiment.
Figure 8:
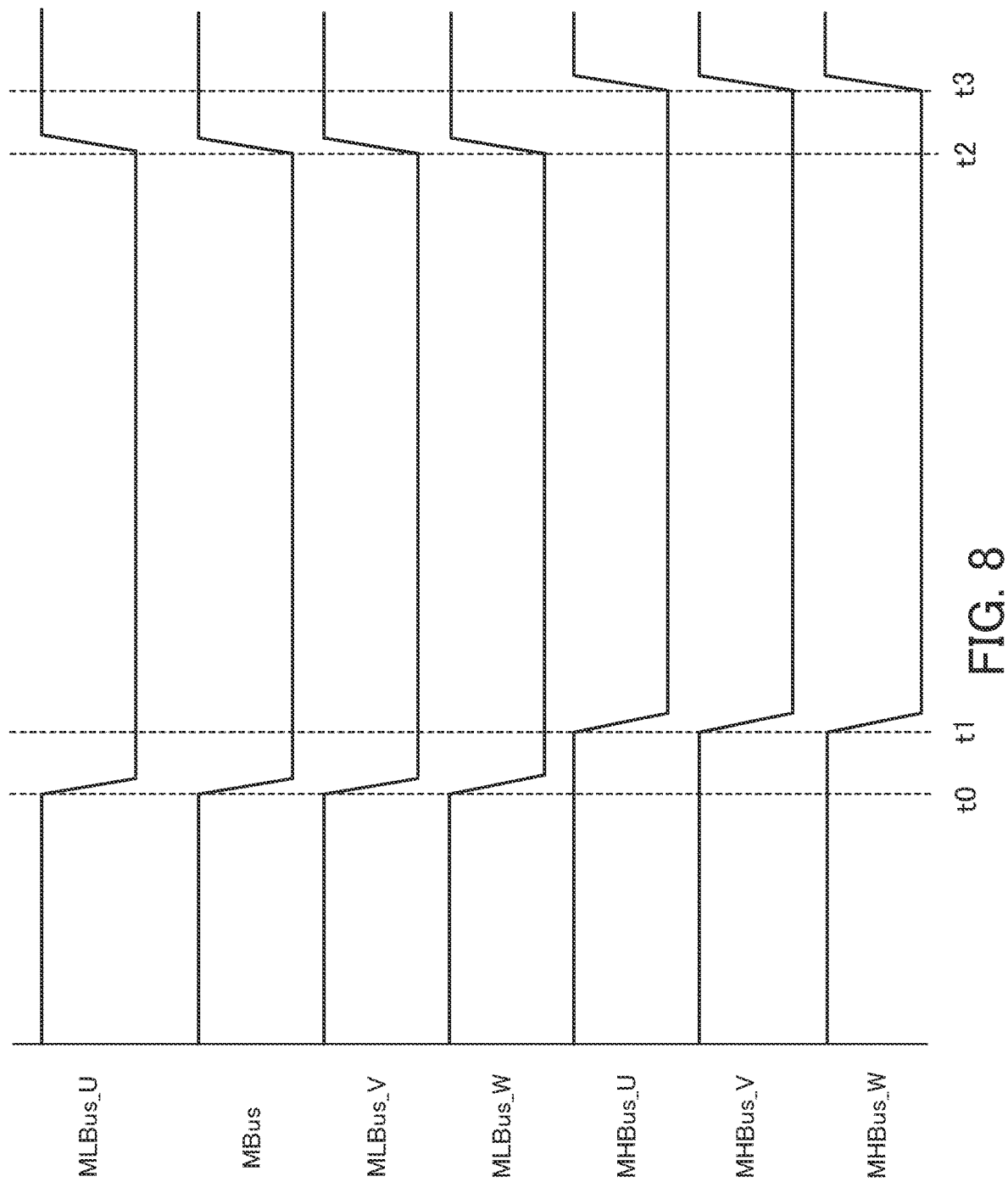
FIG. 8 is a waveform diagram illustrating a synchronized state achieved by the synchronous bridge circuit.

FIG. 7 is a circuit diagram illustrating an example of a configuration of the synchronous bridge circuit according to the first embodiment, and FIG. 8 is a waveform diagram illustrating a synchronized state achieved by the synchronous bridge circuit.

The synchronous bridge circuit 6 includes a pull-up resistor Rpull and a level conversion circuit 30. While the level conversion circuit 30 includes three circuits for the U, V, and W phases, these circuits are illustrated as one circuit in FIG. 7.

One terminal of the pull-up resistor Rpull is connected to a line connected to the positive terminal of the power supply VP2 and supplied with a voltage VCCL, and the other terminal of the pull-up resistor Rpull is connected to a shared bus MBus (a shared connection part). This shared bus MBus is connected to the bus MLBus_U connected to the communication circuit 27 in the low-side control circuit 14 in the U-phase drive device 3. The shared bus MBus is also connected to the bus MLBus_V connected to the low-side control circuit in the V-phase drive device 4, the bus MLBus_W connected to the low-side control circuit in the W-phase drive device 5, and the level conversion circuit 30.

The level conversion circuit 30 is also connected to the bus MHBus_U connected to the high-side control circuit 12 in the U-phase drive device 3 and the buses MHBus_V and MHBus_W connected to the high-side control circuits in the V-phase drive device 4 and the W-phase drive device 5. The level conversion circuit 30 is also connected to high-side power supply terminals VB_U, VB_V, and VB_W and high-side reference potential terminals VS_U, VS_V, and VS_W of the U-phase drive device 3, the V-phase drive device 4, and the W-phase drive device 5.

With this synchronous bridge circuit 6, the low-side control circuit 14 in the U-phase drive device 3, the low-side control circuits in the V-phase drive device 4 and the W-phase drive device 5 are directly connected to the shared bus MBus via the buses MLBus_U, MLBus_V, and MLBus_W. The high-side control circuit 12 in the U-phase drive device 3 and the high-side control circuits in the V-phase drive device 4 and the W-phase drive device 5 are connected to the shared bus MBus via the bus MHBus_U, MHBus_V, MHBus_W and the level conversion circuit 30. That is, the buses MLBus_U, MLBus_V, and MLBus_W and the level conversion circuit 30 are connected to the shared bus MBus to form a wired OR circuit. Thus, when the U-phase drive device 3, the V-phase drive device 4, and the W-phase drive device 5 are in a normal operation, the shared bus MBus is pulled up to an H level by the pull-up resistor Rpull. In addition, when any one of the buses connected to the shared bus MBus is set to an L level, all the buses connected to the shared bus MBus is set to an L level.

Next, an operation of the synchronous bridge circuit 6 performed when a drive capability is switched will be described with reference to FIG. 8. Initially, unless a certain current value or a certain temperature value is detected by any one of the current detection circuits or the temperature detection circuits in this power module, all the buses are at an H level.

At time t0, the low-side control circuit 14 in the U-phase drive device 3 switches the corresponding drive capability. At time t0, since the low-side bus MLBus_U connected to the U-phase drive device 3 drops to an L level, the shared bus MBus and the buses MLBus_V and MLBus_W connected to the V-phase drive device 4 and the W-phase drive device 5 also drop to an L level at the same time. The low-side control circuits in the V-phase drive device 4 and the W-phase drive device 5 is notified of the drop of the level of the shared bus MBus. As a result, these low-side control circuits switch their respective drive capabilities.

The high-side control circuits in the U-phase drive device 3, the V-phase drive device 4, and the W-phase drive device 5 are notified of the drop of the level of the shared bus MBus via the level conversion circuit 30 and the buses MHBus_U, MHBus_V, and MHBus_W. In this operation, since signal processing is performed in the level conversion circuit 30, the levels of the buses MHBus_U, MHBus_V, and MHBus_W are dropped after time t0, more specifically, at time t1. When the high-side control circuits in the U-phase drive device 3, the V-phase drive device 4, and the W-phase drive device 5 are notified of the drop of the levels of the buses MHBus_U, MHBus_V, and MHBus_W, these high-side control circuits switch their respective drive capabilities.

As described above, the synchronous bridge circuit 6 is connected to the low-side control circuits and the high-side control circuits of all the phases. When any one of these control circuits switches the corresponding drive capability, all the other control circuits are simultaneously notified of the switching of the drive capability at that timing. In this way, when any one of the low-side control circuits and the high-side control circuit of all the phases switches the corresponding drive capability, all the other control circuits also switch their respective drive capabilities in synchronization with the switching of the drive capability. Thus, the drive capabilities among the phases are balanced.

When the low-side control circuit 14 in the U-phase drive device 3 switches the corresponding drive capability back to normal and the bus MLBus_U rises to an H level at time t2, the buses MLBus_V and MLBus_W are also switched back to an H level. In synchronization with this, the low-side control circuits in the V-phase drive device 4 and the W-phase drive device 5 also switch their respective drive capabilities back to normal. The levels of the buses MHBus_U, MHBus_V, and MHBus_W rise to an H level after time t2, specifically, at time t3. In addition, the high-side control circuits in the U-phase drive device 3, the V-phase drive device 4, and the W-phase drive device 5 switch their respective drive capabilities back to normal.

Figure 9:
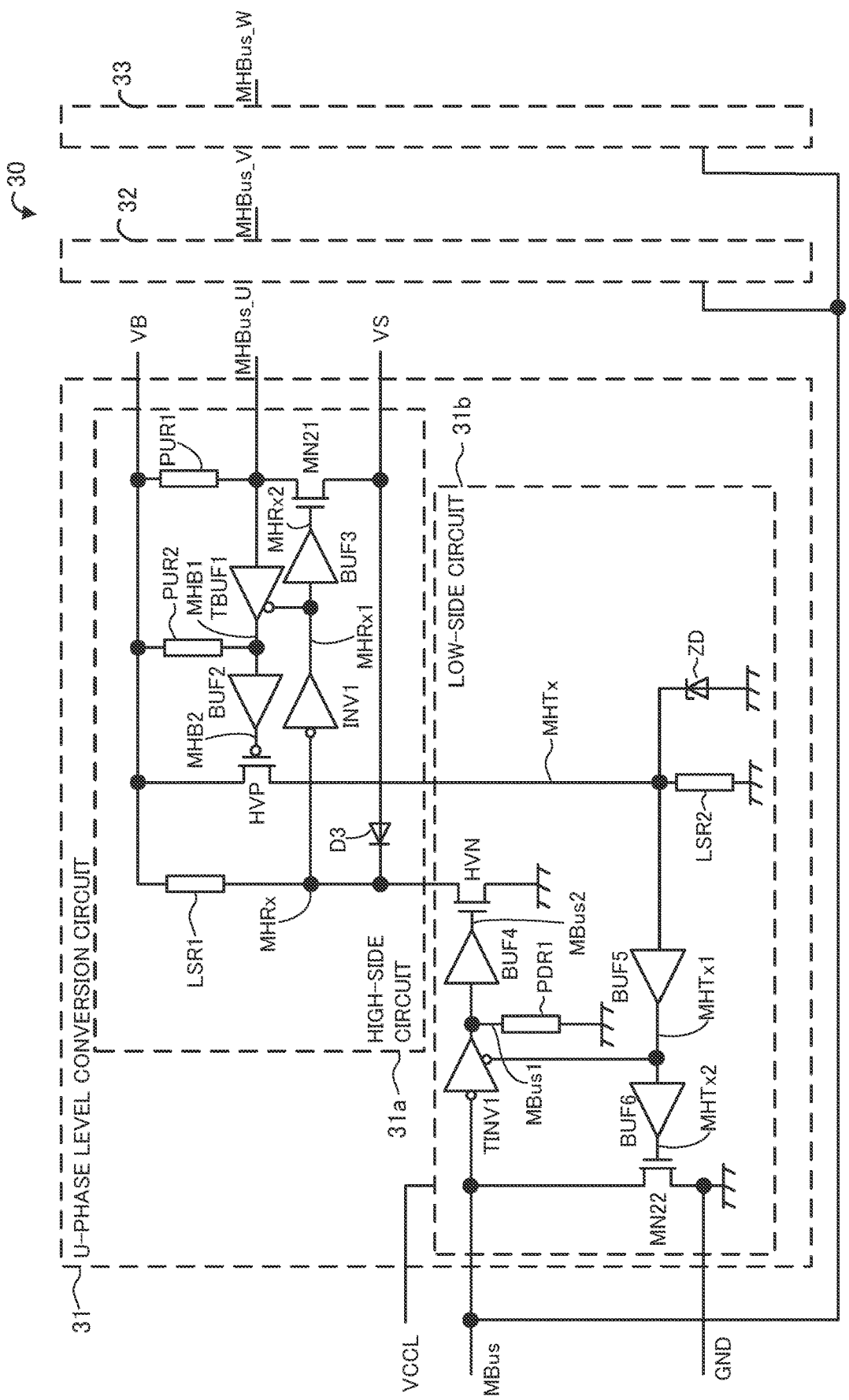
FIG. 9 is a circuit diagram illustrating an example of a configuration of a level conversion circuit in the synchronous bridge circuit according to the first embodiment.
Figure 10:
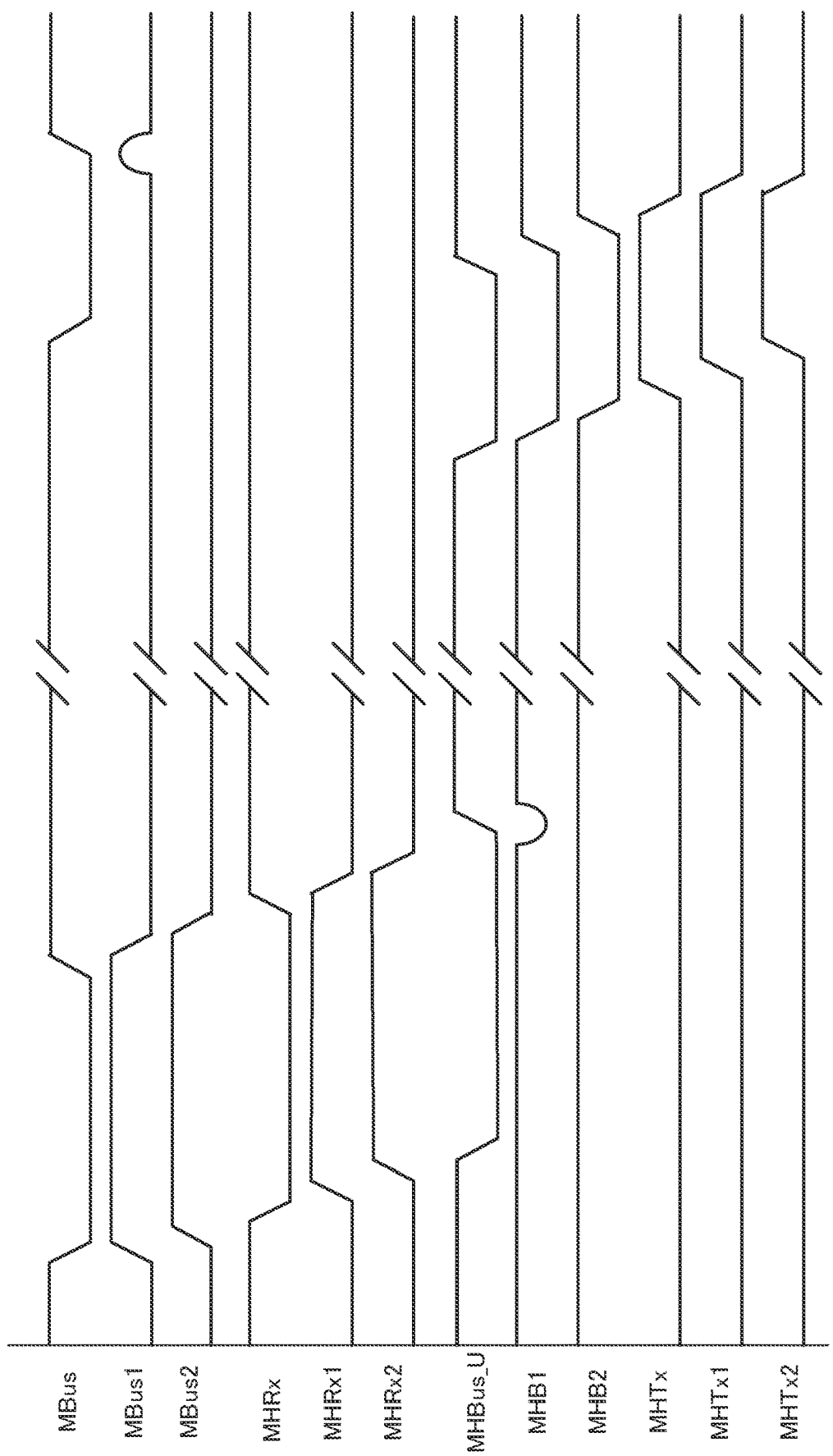
FIG. 10 is a waveform diagram illustrating a synchronized state achieved by the level conversion circuit.

FIG. 9 is a circuit diagram illustrating an example of a configuration of the level conversion circuit in the synchronous bridge circuit according to the first embodiment. FIG. 10 is a waveform diagram illustrating a synchronized state achieved by the level conversion circuit.

The level conversion circuit 30 in the synchronous bridge circuit 6 includes a U-phase level conversion circuit 31, a V-phase level conversion circuit 32, and a W-phase level conversion circuit 33. Since the U-phase level conversion circuit 31, the V-phase level conversion circuit 32, and the W-phase level conversion circuit 33 have the same configuration, the configuration of the U-phase level conversion circuit 31 will hereinafter be described as a representative example.

The U-phase level conversion circuit 31 includes a high-side circuit 31a and a low-side circuit 31b. The U-phase level conversion circuit 31 is connected to the shared bus MBus and the bus MHBus_U and includes a high-side power supply terminal VB, a high-side reference potential terminal VS, a low-side power supply terminal VCCL, and a ground terminal GND.

The high-side circuit 31a includes a pull-up resistor PUR1 having one terminal connected to the high-side power supply terminal VB and the other terminal connected to the bus MHBus_U and the input terminal of a three-state buffer circuit TBUF1. The output terminal of the three-state buffer circuit TBUF1 is connected to one terminal of a pull-up resistor PUR2 and the input terminal of a buffer circuit BUF2. The other terminal of the pull-up resistor PUR2 is connected to the high-side power supply terminal VB. The output terminal of the buffer circuit BUF2 is connected to the gate of a high-voltage PMOS transistor HVP, and the source of the PMOS transistor HVP is connected to the high-side power supply terminal VB.

The high-side circuit 31a also includes a level-shift resistor LSR1 having one terminal connected to the high-side power supply terminal VB and the other terminal connected to the input terminal of an inverter circuit INV1 and the cathode of a diode D3. The anode of the diode D3 is connected to the high-side reference potential terminal VS. The output terminal of the inverter circuit INV1 is connected to the input terminal of a buffer circuit BUF3 and the control terminal of the three-state buffer circuit TBUF1. The output terminal of the buffer circuit BUF3 is connected to the gate of an NMOS transistor MN21. The drain of the NMOS transistor MN21 is connected to the bus MHBus_U, and the source of the NMOS transistor MN21 is connected to the high-side reference potential terminal VS.

The low-side circuit 31b includes a three-state inverter circuit TINV1 having an input terminal connected to the shared bus MBus and an output terminal connected to one terminal of a pull-down resistor PDR1 and the input terminal of a buffer circuit BUF4. The other terminal of the pull-down resistor PDR1 is connected to ground. The output terminal of the buffer circuit BUF4 is connected to the gate of a high-voltage NMOS transistor HVN. The drain of the NMOS transistor HVN is connected to the other terminal of the level-shift resistor LSR1 in the high-side circuit 31a. The source of the NMOS transistor HVN is connected to ground.

The low-side circuit 31b also includes a level-shift resistor LSR2 having one terminal connected to the drain of the PMOS transistor HVP in the high-side circuit 31a, the cathode of a Zener diode ZD, and the input terminal of a buffer circuit BUF5. The anode of the Zener diode ZD and the other terminal of the level-shift resistor LSR2 are connected to ground. The output terminal of the buffer circuit BUF5 is connected to the input terminal of a buffer circuit BUF6 and the control terminal of the three-state inverter circuit TINV1. The output terminal of the buffer circuit BUF6 is connected to the gate of an NMOS transistor MN22. The drain of the NMOS transistor MN22 is connected to the input terminal of the three-state inverter circuit TINV1, and the source of the NMOS transistor MN22 is connected to ground.

The PMOS transistor HVP in the high-side circuit 31a and the level-shift resistor LSR2 and the Zener diode ZD in the low-side circuit 31b constitute a level-down circuit that notifies the low-side circuit 31b of information about the high-side circuit 31a. The level-shift resistor LSR1 in the high-side circuit 31a and the NMOS transistor HVN in the low-side circuit 31b constitute a level-up circuit that notifies the high-side circuit 31a of information about the low-side circuit 31b.

With the above-described configuration, in a normal operation in which none of the U-phase drive device 3, the V-phase drive device 4, and the W-phase drive device 5 have switched their respective drive capabilities, the shared bus MBus and the bus MHBus_U connected to the U-phase drive device 3 indicate an H level, as illustrated in FIG. 10. In this state, in the low-side circuit 31b, input and output signals MBus1 and MBus2 of the buffer circuit BUF4, input and output signals MHTx1 and MHTx2 of the buffer circuit BUF6, and a signal MHTx of the level-down circuit all indicate an L level. In the high-side circuit 31a, input and output signals MHB1 and MHB2 of the buffer circuit BUF2 indicate the H level, input and output signals MHRx1 and MHRx2 of the buffer circuit BUF3 indicate the L level, and a signal MHRx of the level-up circuit indicates the H level.

In this state, assuming that the low-side control circuit 14 in the U-phase drive device 3 switches the corresponding drive capability and that the shared bus MBus drops to an L level, the signal MBus1 outputted by the three-state inverter circuit TINV1 in the low-side circuit 31b in the U-phase level conversion circuit 31 rises to an H level. Next, the buffer circuit BUF4 also outputs an H-level signal MBus2 and sets the NMOS transistor HVN to an on-state. As a result, since the inverter circuit INV1 in the high-side circuit 31a receives an L-level signal MHRx, the inverter circuit INV1 outputs an H-level signal MHRx1. Accordingly, the buffer circuit BUF3 outputs an H-level signal MHRx2 and sets the NMOS transistor MN21 to an on-state. Thus, the bus MHBus_U drops to an L level, this L-level signal is transferred to the communication circuit in the high-side control circuit 12, and the drive capability is switched. In this state, since the control terminal of the three-state buffer circuit TBUF1 in the high-side circuit 31a is receiving an H-level signal, the output is in a high impedance state. Thus, the three-state buffer circuit TBUF1 does not notify the buffer circuit BUF2 of the change in the logical level of the bus MHBus_U.

Next, after the above switching, when the low-side control circuit 14 switches the corresponding drive capability back to normal and the shared bus MBus rises back to an H level, the NMOS transistor HVN is set to an off-state, and the low-side circuit 31b stops notifying the high-side circuit 31a of the information about the low-side circuit 31b.

In contrast, assuming that the high-side control circuit 12 in the U-phase drive device 3 switches the corresponding drive capability and that the bus MHBus_U drops to an L level, the three-state buffer circuit TBUF1 in the high-side circuit 31a in the U-phase level conversion circuit 31 outputs an L-level signal MHB1. Next, the buffer circuit BUF2 also outputs an L-level signal MHB2 and sets the PMOS transistor HVP to an on-state. As a result, since the buffer circuit BUF5 in the low-side circuit 31b receives an H-level signal MHTx, the buffer circuit BUF5 outputs an H-level signal MHTx1. Consequently, the buffer circuit BUF6 outputs an H-level signal MHTx2 and sets the NMOS transistor MN22 to an on-state. Thus, the shared bus MBus is set to an L level, and the communication circuit 27 in the low-side control circuit 14 is notified of this L-level signal. In this state, since the control terminal of the three-state inverter circuit TINV1 in the low-side circuit 31b is receiving an H-level signal, the output is in a high impedance state.

Thus, the three-state inverter circuit TINV1 does not notify the buffer circuit BUF4 of the change in the logical level of the shared bus MBus.

Next, after the above switching, when the high-side control circuit 12 switches the corresponding drive capability back to normal and the bus MHBus_U rises back to an H level, the PMOS transistor HVP is set to the off-state, and the high-side circuit 31a stops notifying the low-side circuit 31b of the information about the high-side circuit 31a.

Second Embodiment

Figure 11:
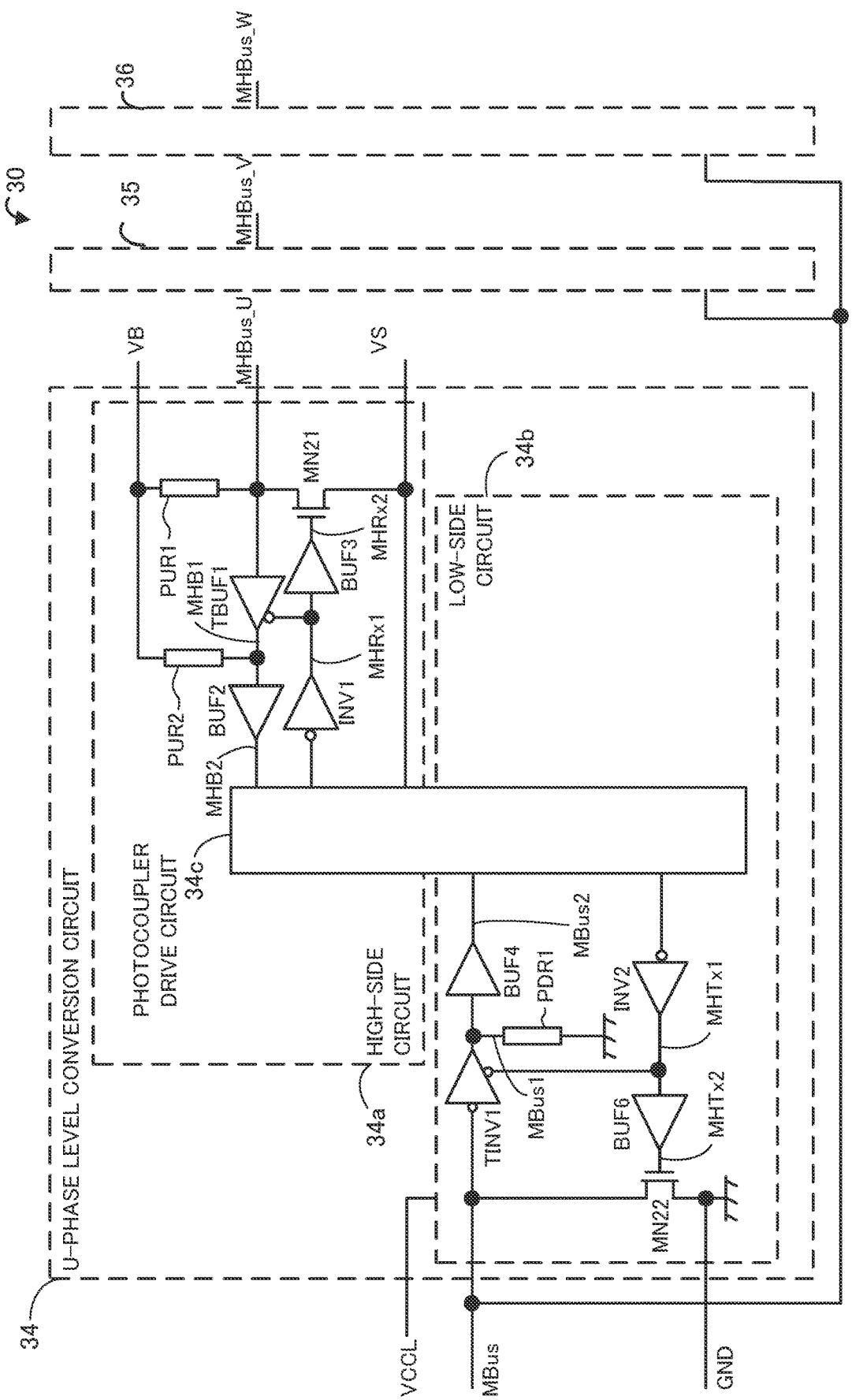
FIG. 11 is a circuit diagram illustrating an example of a configuration of a level conversion circuit in a synchronous bridge circuit according to a second embodiment.

FIG. 11 is a circuit diagram illustrating an example of a configuration of a level conversion circuit 30 in a synchronous bridge circuit 6 according to a second embodiment. Elements in FIG. 11 that are equivalent to those in FIG. 9 will be denoted by like reference characters, and detailed description thereof will be omitted.

A power module according to second the embodiment differs from the power module according to the first embodiment only in the level conversion circuit 30 in the synchronous bridge circuit 6. In the case of the power module according to the second embodiment, the level conversion circuit 30 in the synchronous bridge circuit 6 includes a U-phase level conversion circuit 34, a V-phase level conversion circuit 35, and a W-phase level conversion circuit 36. Since the U-phase level conversion circuit 34, the V-phase level conversion circuit 35, and the W-phase level conversion circuit 36 have the same configuration, the configuration of the U-phase level conversion circuit 34 will hereinafter be described as a representative example.

This U-phase level conversion circuit 34 includes a high-side circuit 34a and a low-side circuit 34b. The U-phase level conversion circuit 34 includes a photocoupler drive circuit 34c that performs a bidirectional signal transfer between the high-side circuit 34a and the low-side circuit 34b.

The photocoupler drive circuit 34c includes a level-up circuit that supplies a signal MBus2 outputted by a buffer circuit BUF4 in the low-side circuit 34b to the input terminal of an inverter circuit INV1 in the high-side circuit 34a. The photocoupler drive circuit 34c includes a level-down circuit that supplies a signal MHB2 outputted by a buffer circuit BUF2 in the high-side circuit 34a to the input terminal of an inverter circuit INV2 in the low-side circuit 34b. The level-up circuit and are each constituted by an the level-down circuit isolation element such as a photocoupler.

This U-phase level conversion circuit 34 causes the photocoupler drive circuit 34c to perform signal transfer between the high-side circuit 34a and the low-side circuit 34b. Other than this, this U-phase level conversion circuit 34 operates in the same way as the U-phase level conversion circuit 31 according to the first embodiment.

Third Embodiment

Figure 12:
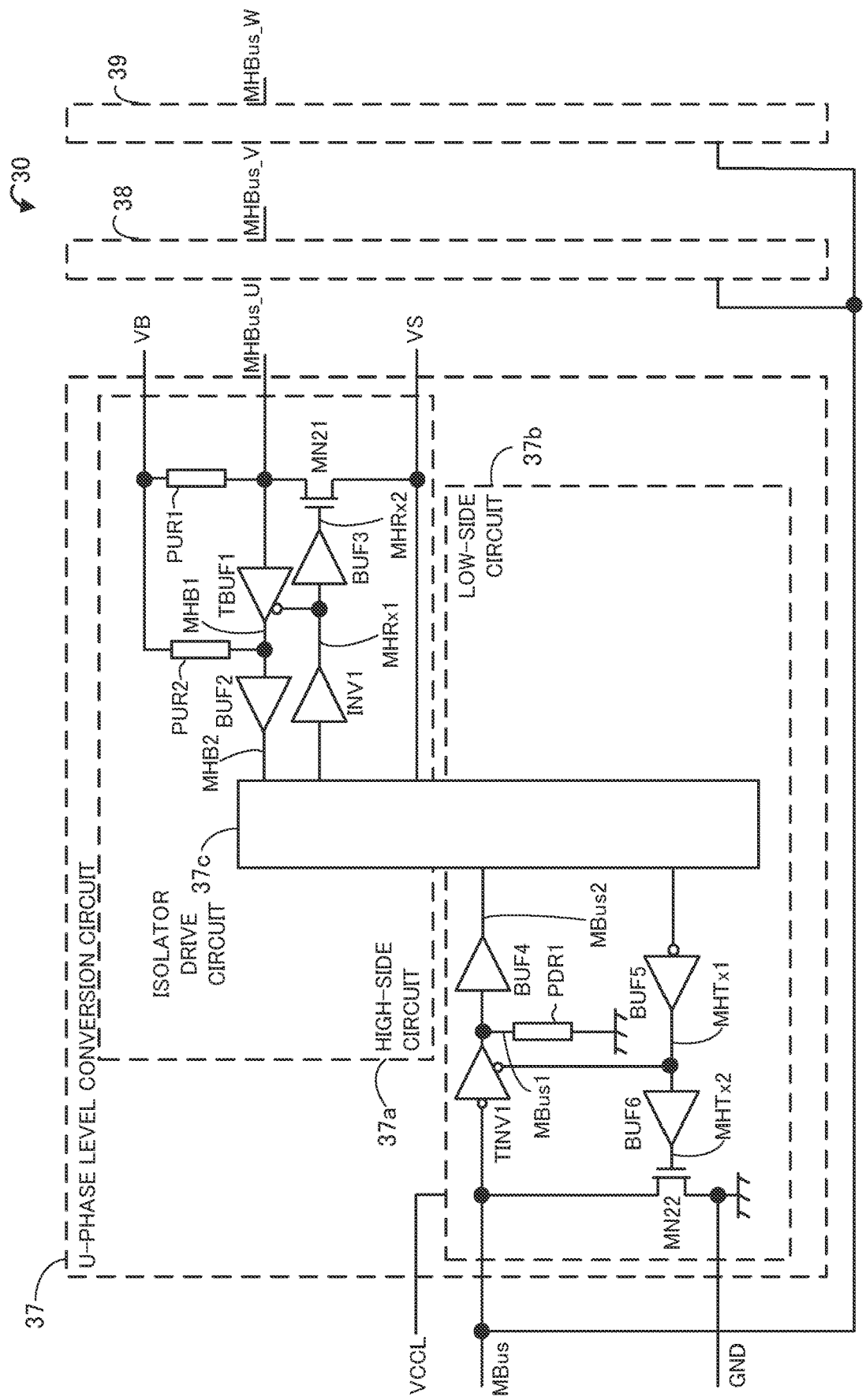
FIG. 12 is a circuit diagram illustrating an example of a configuration of a level conversion circuit bridge circuit according to a third in a synchronous embodiment.

FIG. 12 is a circuit diagram illustrating an example of a configuration of a level conversion circuit 30 in a synchronous bridge circuit 6 according to a third embodiment; embodiment. Elements in FIG. 12 that are equivalent to those in FIG. 11 will be denoted by like reference characters, and detailed description thereof will be omitted.

A power module according to the third embodiment differs from the power module according to the second embodiment only in the level conversion circuit 30 in the synchronous bridge circuit 6. The level conversion circuit 30 according to the third embodiment includes a U-phase level conversion circuit 37, a V-phase level conversion circuit 38, and a W-phase level conversion circuit 39. Since the U-phase level conversion circuit 37, the V-phase level conversion circuit 38, and the W-phase level conversion circuit 39 have the same configuration, the configuration of the U-phase level conversion circuit 37 will hereinafter be described as a representative example.

This U-phase level conversion circuit 37 includes a high-side circuit 37a and a low-side circuit 37b. In addition, an isolator drive circuit 37c constituted by isolation elements is disposed between the high-side circuit 37a and the low-side circuit 37b.

The isolator drive circuit 37c includes a level-up circuit that supplies a signal MBus2 outputted by a buffer circuit BUF4 in the low-side circuit 37b to the input terminal of an inverter circuit INV1 in the high-side circuit 37a. In addition, the isolator drive circuit 37c includes a level-down circuit that supplies a signal MHB2 outputted by a buffer circuit BUF2 in the high-side circuit 37a to the input terminal of a buffer circuit BUF5 in the low-side circuit 37b. The level-up circuit and the level-down circuit are each constituted by an isolation element such as a transformer.

This U-phase level conversion circuit 37 causes the isolator drive circuit 37c to perform signal transfer between the high-side circuit 37a and the low-side circuit 37b. Other than this, the U-phase level conversion circuit 37 operates in the same way as the U-phase level conversion circuit 31 according to the first embodiment.

Fourth Embodiment

Figure 13:
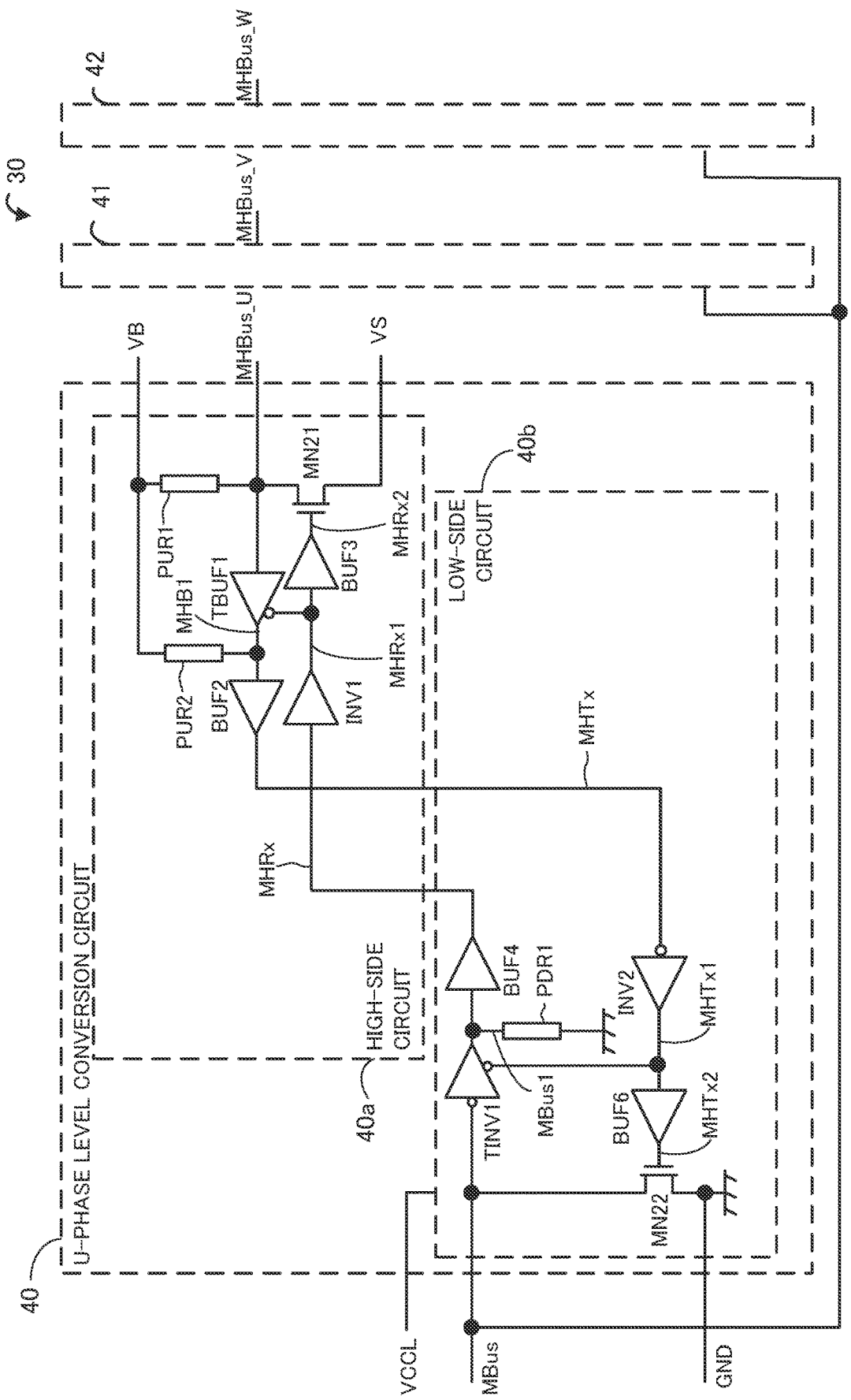
FIG. 13 is a circuit diagram illustrating an example of a configuration of a level conversion circuit in a synchronous bridge circuit according to a fourth embodiment.

FIG. 13 is a circuit diagram illustrating an example of a configuration of a level conversion circuit 30 in a synchronous bridge circuit 6 according to a fourth embodiment. Elements in FIG. 13 that are equivalent to those in FIG. 11 will be denoted by like reference characters, and detailed description thereof be omitted.

In the case of a power module according to the fourth embodiment, the level conversion circuit 30 in the synchronous bridge circuit 6 includes a U-phase level conversion circuit 40, a V-phase level conversion circuit 41, and a W-phase level conversion circuit 42. Since the U-phase level conversion circuit 40, the V-phase level conversion circuit 41, and the W-phase level conversion circuit 42 have the same configuration, the configuration of the U-phase level conversion circuit 40 will hereinafter be described as a representative example.

In this U-phase level conversion circuit 40, a high-side circuit 40a and a low-side circuit 40b are directly coupled to each other without using a level shift circuit such as a level-up circuit or a level-down circuit. Thus, the power module according to the fourth embodiment is useful when the voltage of the power supply 8 applied to a half-bridge output circuit constituted by a high-side drive element 11 and a low-side drive element 13 is low.

In the case of this U-phase level conversion circuit 40, the output terminal of a buffer circuit BUF4 in the low-side circuit 40b is connected to the input terminal of an inverter circuit INV1 in the high-side circuit 40a, and a single MHRx outputted by the buffer circuit BUF4 is directly supplied to the inverter circuit INV1. In addition, in the case of the U-phase level conversion circuit 40, the output terminal of a buffer circuit BUF2 in the high-side circuit 40a is connected to the input terminal of an inverter circuit INV2 in the low-side circuit 40b, and a signal MHTx outputted by the buffer circuit BUF2 is directly supplied to the inverter circuit INV2.

Except that the signal transfer between the high-side circuit 40a and the low-side circuit 40b is directly performed in the U-phase level conversion circuit 40, the U-phase level conversion circuit 40 operates in the same way as the U-phase level conversion circuit 31 according to the first embodiment.

With the power modules and the level conversion circuits configured as described above, when any one of the high-side control circuits and the low-side control circuits of the phases has switched the corresponding drive capability, all the DCSF-equipped drive circuits switch their respective drive capabilities. Thus, the drive capabilities among the phases are balanced, and the switching noise and switching loss reduction effects are improved.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A power module, comprising:
  a plurality of drive devices, each of which includes
    a high-side drive element and a low-side drive element that drive a load,
    a high-side control circuit that controls the high-side drive element, and
    a low-side control circuit that controls the low-side drive element, wherein
    each of the high-side control circuit and the low-side control circuit includes
      an abnormality detection circuit that detects an abnormal state of the high-side drive element or low-side drive element,
      a capability-switch-function-equipped drive circuit that switches a drive capability of the high-side drive element or low-side drive element, responsive to the detection of the abnormal state by any one of the plurality of abnormality detection circuits in the plurality of drive devices, and
      a drive capability switch circuit that switches a drive capability of the capability-switch-function-equipped drive circuit, responsive to the detection of the abnormal state by the abnormality detection circuit, wherein
  the plurality of drive devices includes a first drive device and a second drive device that are separate from each other, and
  the capability-switch-function-equipped drive circuit of the first drive device switches the drive capability of the high-side drive element or low-side drive element of the first drive device, responsive to the detection of the abnormal state in the second device.

2. A power module, comprising:
  a plurality of drive devices, each of which includes
    a high-side drive element and a low-side drive element that drive a load,
    a high-side control circuit that controls the high-side drive element, and
    a low-side control circuit that controls the low-side drive element, wherein
    each of the high-side control circuit and the low-side control circuit includes
      an abnormality detection circuit that detects an abnormal state of the high-side drive element or low-side drive element,
      a capability-switch-function-equipped drive circuit that switches a drive capability of the high-side drive element or low-side drive element to be higher than the drive capability thereof in a normal operation, responsive to the detection of the abnormal state by any one of the plurality of abnormality detection circuits in the plurality of drive devices, and
      a drive capability switch circuit that switches a drive capability of the capability-switch-function-equipped drive circuit, responsive to the detection of the abnormal state by the abnormality detection circuit, wherein
  the plurality of drive devices includes a first drive device and a second drive device that are separate from each other, and
  the capability-switch-function-equipped drive circuit of the first drive device switches the drive capability of the high-side drive element or low-side drive element of the first drive device, responsive to the detection of the abnormal state in the second device.

3. The power module according to claim 2, further comprising a synchronous bridge circuit connected to each of the high-side control circuits and the low-side control circuits of the plurality of drive devices, wherein
  when any one of the abnormality detection circuits detects the abnormal state, all of the high-side control circuits and the low-side control circuits other than the high-side control circuit or low-side control circuit including the abnormality detection circuit that has detected the abnormal state are notified of the detection of the abnormal state via the synchronous bridge circuit.

4. The power module according to claim 3, wherein each of the high-side control circuits and the low-side control circuits further includes a communication circuit that
  transmits, when the abnormality detection circuit in said each high-side or low-side control circuit detects the abnormal state, information about the detection of the abnormal state to the synchronous bridge circuit, and
  receives information about the abnormal state detected by another one of the high-side control circuits or low-side control circuits from the synchronous bridge circuit.

5. The power module according to claim 4,
  wherein the synchronous bridge circuit includes a shared connection part connected to all of the communication circuits in the plurality of drive devices,
  wherein, in the normal operation, the shared connection part is maintained at a first voltage level, and
  wherein, when the information about the detection of the abnormal state is transmitted from any one of the high-side control circuits or low-side control circuits, the shared connection part is switched to a second voltage level, and the synchronous bridge circuit notifies all of the high-side control circuits and the low-side control circuits other than said one high-side or low-side control circuit of the detection of the abnormal state.

6. The power module according to claim 5,
  wherein the low-side control circuits are connected to a power supply, wherein the synchronous bridge circuit further includes a pull-up resistor having one end connected to the shared connection part and the other end connected to the power supply, and wherein a potential of the shared connection part is set to the first voltage level, which is a voltage of the power supply.

7. The power module according to claim 5, wherein each of the communication circuits includes a buffer circuit that receives a signal of the first voltage level or the second voltage level, and transmits the signal to the drive capability switch circuit in the high-side control circuit or low-side control circuit containing said each communication circuit, and a switching element that receives the information about the detection of the abnormal state and switches a potential of the shared connection part from the first voltage level to the second voltage level.

8. The power module according to claim 5, wherein the synchronous bridge circuit further includes a level conversion circuit between the shared connection part and the communication circuits in the high-side control circuits.

9. The power module according to claim 8, wherein the level conversion circuit includes a high-side circuit that is connected to the communication circuits in the high-side control circuits and that handles high-side information, and a low-side circuit that is connected to the shared connection part and that handles low-side information, wherein the high-side circuit and the low-side circuit exchange the high-side information and the low-side information with each other.

10. The power module according to claim 9, wherein the high-side circuit transmits the high-side information to the low-side circuit, and stops the transmission upon receiving notification of the low-side information from the low-side circuit, and wherein the low-side circuit transmits the low-side information to the high-side circuit, and stops the transmission upon receiving notification of the high-side information from the high-side circuit.

11. The power module according to claim 10, wherein the level conversion circuit further includes a level-up circuit that raises the low-side information and a level-down circuit that drops the high-side information between the high-side circuit and the low-side circuit.

12. The power module according to claim 11, wherein the high-side control circuits are connected to another power supply, wherein the low-side control circuits are connected to a ground level, wherein the level-up circuit includes a first high-voltage transistor controlled by the low-side information, and a first level-shift resistor having one end connected to the another power supply and the other end connected to the first high-voltage transistor, and wherein the level-down circuit includes a second high-voltage transistor controlled by the high-side information, and a second level-shift resistor having one end connected to the ground level and the other end connected to the second high-voltage transistor.

13. The power module according to claim 11, wherein the level-up circuit includes a first isolation element that transmits the low-side information to the high-side circuit, and a second isolation element that transmits the high-side information to the low-side circuit.

14. The power module according to claim 2, wherein the abnormality detection circuit includes a current detection circuit that detects an overcurrent state of the high-side drive element or low-side drive element, and wherein, when the current detection circuit detects the overcurrent state, the current detection circuit causes the drive capability switch circuit to switch the drive capability of the capability-switch-function-equipped drive circuit.

15. The power module according to claim 2, wherein the abnormality detection circuit includes a temperature detection circuit that detects an overheat state of the high-side drive element or low-side drive element, and wherein, when the temperature detection circuit detects the overheat state, the temperature detection circuit causes the drive capability switch circuit to switch the drive capability of the capability-switch-function-equipped drive circuit.

16. A level conversion circuit of a power module that includes a low-side control circuit and a high-side control circuit, the level conversion circuit comprising:

a first transfer circuit that transfers low-side information indicating abnormality of the low-side control circuit to the high-side control circuit, and a second transfer circuit that transfers high-side information indicating abnormality of the high-side control circuit to the low-side control circuit, wherein the first transfer circuit stops transferring the low-side information in response to the second transfer circuit transferring the high-side information, and the second transfer circuit stops transferring the high-side information in response to the first transfer circuit transferring the low-side information.

17. The level conversion circuit of the power module according to claim 16, wherein the first transfer circuit includes a level-up circuit that raises the low-side information, and the second transfer circuit includes a level-down circuit that drops the high-side information.

18. The level conversion circuit of the power module according to claim 16, wherein the level conversion circuit comprising:

a level-up circuit that raises the low-side information, a first circuit that is included in the first transfer circuit and drives the level-up circuit, a level-down circuit that drops the high-side information, and a second circuit that is included in the second transfer circuit and drives the level-down circuit; and wherein in response to the level-up circuit raising the low-side information upon receiving a first output level from the first circuit and the first transfer circuit transferring the low-side information, the second circuit outputs a third output level to stop the level-down circuit from dropping the high-side information, so that the second transfer circuit stops transferring the high-side information, and in response to the level-down circuit dropping the high-side information in response to a second output level from the second circuit and the second transfer circuit transferring the high-side information, the first circuit outputs the third output level to stop the level-up circuit from raising the low-side information, so that the first transfer circuit stops transferring the low-side information.

19. The level conversion circuit of the power module according to claim 18, wherein the third output level corresponds to a high-impedance state.

20. A power module, comprising:
a plurality of drive devices, each of which includes
a high-side drive element and a low-side drive element that drive a load,
a high-side control circuit that controls the high-side drive element, and
a low-side control circuit that controls the low-side drive element, wherein
each of the high-side control circuit and the low-side control circuit includes
an abnormality detection circuit that detects an abnormal state of the high-side drive element or low-side drive element,
a capability-switch-function-equipped drive circuit that switches a drive capability of the high-side drive element or low-side drive element, responsive to the detection of the abnormal state by any one of the plurality of abnormality detection circuits in the plurality of drive devices, and
a drive capability switch circuit that switches a drive capability of the capability-switch-function-equipped drive circuit, responsive to the detection of the abnormal state by the abnormality detection circuit; and
a synchronous bridge circuit connected to each of the high-side control circuits and the low-side control circuits of the plurality of drive devices, wherein
when information about the detection of the abnormal state is transmitted from any one of the high-side control circuits or low-side control circuits, the synchronous bridge circuit notifies all of the high-side control circuits and the low-side control circuits other than said one high-side or low-side control circuit of the detection of the abnormal state.

* * * * *